United States Patent [19]
Li et al.

[11] Patent Number: 5,502,781
[45] Date of Patent: Mar. 26, 1996

[54] INTEGRATED OPTICAL DEVICES UTILIZING MAGNETOSTRICTIVELY, ELECTROSTRICTIVELY OR PHOTOSTRICTIVELY INDUCED STRESS

[75] Inventors: Yuan P. Li, Scotch Plains; Raymond Wolfe, New Providence, both of N.J.

[73] Assignee: AT&T Corp., Murray Hill, N.J.

[21] Appl. No.: 378,162

[22] Filed: Jan. 25, 1995

[51] Int. Cl.$^6$ ............... G02F 1/295; G02B 6/26; G01B 9/02
[52] U.S. Cl. ............ 385/4; 385/6; 385/9; 385/15; 385/16; 385/40; 385/41; 385/132; 385/45; 385/14; 356/345
[58] Field of Search ............ 385/2, 4, 6, 7, 385/8, 9, 11, 14, 15, 16, 17, 24, 39, 40, 41, 42, 45, 131, 132; 356/345, 349, 350, 351; 359/494, 495

[56] References Cited

U.S. PATENT DOCUMENTS

3,645,603  2/1972  Smith ................... 385/4 X (List continued on next page.)

OTHER PUBLICATIONS

Chikazumi, S., and Charap, S. H., *Physics of Magnetism*, John Wiley & Sons, Inc., New York, 1964, pp. 431–433, 436.
Clark, A. E., "Magnetostrictive Materials," *Concise Encyclopedia of Magnetic & Superconducting Materials*, Pergamon Press, pp. 283–287 (Jan Evetts et., Pergamon Press 1992). (No Month).
Erickson, J. R., "Signal–to–Noise Ratio Simulations for Small, Guided–wave Optical Networks," SPIE vol. 752, Digital Optical Computing, 1987, pp. 222–229. (No Month).
Jaffe, B., et al., "Piezoelectric Ceramics," 78–85 (Academic Press, 1971). (No Month).
Okuno, M., et al., "Birefringence Control of Silica Waveguides on Si and Its Application to a Polarization-–Beam Splitter/Switch," Journal of Lightwave Technology, vol. 12, No. 4, Apr. 1994, pp. 625–633.
Padmanabhan, K., and Netravali, A. N., "Dilated Networks for Photonic Switching," IEEE Transactions on Communications, vol. COM–35, No. 12, Dec. 1987, pp. 1357–1365.
Shani, Y., et al., "Integrated Optic Adiabatic Devices on Silicon," IEEE Journal of Quantum Electronics, vol. 27, No. 3, Mar. 1991, pp. 556–566.
Uchino, Kenji, and Chu, Sheng–Yuan, "Photostriction and its Applications", Proc. of American Ceramic Society Conference, pp. 287–293 (Hawaii, Nov. 1993).
Uchino, Kenji, and Chu, Sheng–Yuan, "Photo–acoustic Devices Using {Pb, La} {Zr, Ti}, $O_3$ Ceramics", Int'l Symposium on Applications of Farroelectrics, Proceedings of 1994 Conf. at Pennsylvania State Univ. (Summer 1994). (No Month).

*Primary Examiner*—Brian Healy

[57] ABSTRACT

Integrated optical devices which utilize a magnetostrictively, electrostrictively or photostrictively induced stress to alter the optical properties of one or more waveguides in the device are disclosed. The integrated optical devices consist of at least one pair of optical waveguides preferably fabricated in a cladding material formed on a substrate. A stress applying material, which may be a magnetostrictive, electrostrictive or photostrictive material, is affixed to the upper surface of the cladding material near at least one of the optical waveguides. When the appropriate magnetic, electric or photonic field is applied to the stress applying material, a dimensional change tends to be induced in the stress applying material. The constrained state of the stress applying material, however, caused by its adhesion to the cladding material, causes regions of tensile and compressive stress, as well as any associated strains, to be created in the integrated optical device. By positioning one or more optical waveguides in a region of the device which will be subjected to a tensile or compressive stress, the optical properties of the stressed waveguide may be varied to achieve switching and modulation. Latchable integrated optical devices are achieved by utilizing a controlled induced stress to "tune" one or more waveguides in an integrated optical device to a desired refractive index or birefringence, which will be retained after the field is removed.

24 Claims, 6 Drawing Sheets

U.S. PATENT DOCUMENTS

| | | | |
|---|---|---|---|
| 3,850,503 | 11/1974 | Riseberg et al. | 385/41 X |
| 4,032,216 | 6/1977 | Henry | 385/6 X |
| 4,211,467 | 7/1980 | Cross et al. | 385/14 X |
| 4,273,411 | 6/1981 | Alferness | 385/132 X |
| 4,387,353 | 6/1983 | Giallorenzi et al. | 385/40 X |
| 4,433,291 | 2/1984 | Yariv et al. | 385/345 X |
| 4,645,293 | 2/1987 | Yoshida et al. | 385/132 X |
| 4,674,829 | 6/1987 | Bulmer et al. | 385/132 X |
| 4,711,515 | 12/1987 | Alferness | 385/41 |
| 4,729,620 | 3/1988 | Pavlath | 356/350 X |
| 4,756,588 | 7/1988 | Granestrand | 385/132 X |
| 4,763,974 | 8/1988 | Thaniyavarn | 385/14 X |
| 4,772,084 | 9/1988 | Bogert | 385/132 X |
| 4,820,009 | 4/1989 | Thaniyavarn | 385/15 X |
| 4,865,408 | 9/1989 | Korotky | 385/41 X |
| 4,937,833 | 6/1990 | Kabacoff | 372/28 |
| 4,996,692 | 2/1991 | Kabacoff | 372/26 |
| 5,056,885 | 10/1991 | Chinn | 356/350 X |
| 5,095,515 | 3/1992 | Seaver | 385/16 |
| 5,185,830 | 2/1993 | Nishimoto | 385/41 |
| 5,189,713 | 2/1993 | Shaw | 385/2 |
| 5,305,075 | 4/1994 | Bucholtz et al. | 356/345 |
| 5,329,601 | 7/1994 | Nakamura | 385/41 |
| 5,371,812 | 12/1994 | Nakamura | 385/9 |
| 5,400,418 | 3/1995 | Pearson et al. | 385/11 |
| 5,428,695 | 6/1995 | Ohta | 385/14 |

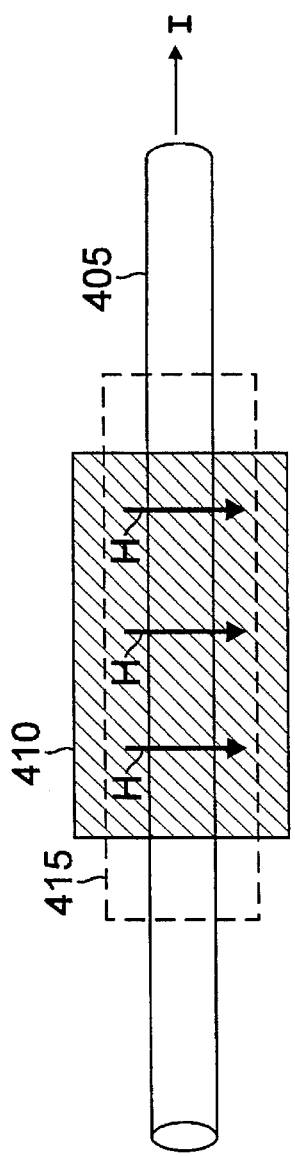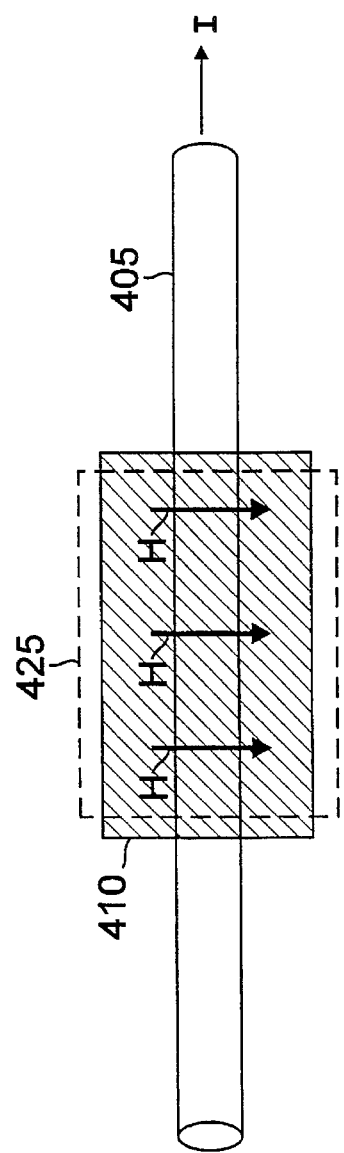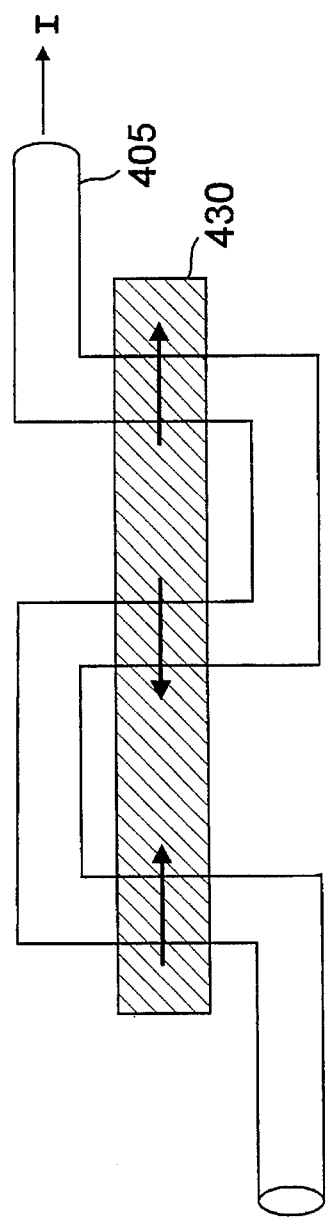

INTEGRATED OPTICAL DEVICES UTILIZING MAGNETOSTRICTIVELY, ELECTROSTRICTIVELY OR PHOTOSTRICTIVELY INDUCED STRESS

FIELD OF THE INVENTION

The present invention relates to integrated optical devices, and more particularly, to integrated optical devices utilizing magnetostriction, electrostriction or photostriction to induce a stress which will alter the optical properties of one or more waveguides, such as silica glass waveguides, in the integrated optical device.

BACKGROUND OF THE INVENTION

The use of optical signals to represent data and other information in communication and data processing applications has become increasingly popular. The increased popularity is due in large part to the significantly higher bit rates allowed by the higher frequencies of the carrier signals, over conventional electrical conductor or wireless techniques. The switching or modulation of information from a source to its destination is a critical function in any communication or data processing system. Many optical systems, however, have experienced difficulty with the switching or modulation of the optical signals, and in particular have encountered difficulties with optical transmissions due to the lossy nature of many conventional optical interfaces.

A number of optical switches and modulators have been developed or proposed which utilize the magneto-optic or electro-optic effect to vary the optical properties, such as the refractive index, of an optical material, upon the application of the appropriate magnetic or electric field. For a discussion of conventional optical switching and modulation devices based on the magneto-optic or electro-optic effect, see, for example, U.S. Pat. No. 4,211,467 to Cross et al. and U.S. Pat. No. 4,820,009 to Thaniyavarn.

Glass waveguides are often utilized in optical devices because they exhibit lower loss and stable optical properties, and are easier to couple to optical fibers. Unlike semiconductor and electro-optic materials, however, the optical properties of glass waveguides are often difficult to control. A number of optical devices have been developed or proposed which utilize a stress applied to a glass fiber or waveguide to alter the index of refraction of the glass. These optical devices, however, do not allow a variable stress to be applied to the waveguide. Thus, these devices do not allow a continuous range of optical intensities to be provided at the output of the optical device.

For example, one system, described in Marayuki Okuno et al., "Birefringence Control of Silica Waveguides on Si and Its Application to a Polarization-Beam Splitter/Switch", Journal of Lightwave Technology, Vol. 12, No. 4, pp. 625–33 (April, 1994), has been proposed which applies a permanent fixed stress during the fabrication process to one or more glass waveguides in an integrated optical device to establish desired refractive indices and birefringence. Thereafter, during operation, the thermo-optic effect is utilized to alter the optical properties of the waveguides to achieve switching or modulation.

While the Okuno system provides an effective basis for switching an optical signal from one path to another, or for modulating an optical signal between an on and off state, the Okuno system requires the continuous application of power to heat regions of the optical device. In addition, the applied heat may not be localized to a desired region of the waveguides in the integrated optical device, which is of particular concern, for example, where the two waveguides come close together in the coupling region of the integrated optical device.

U.S. Pat. No. 5,095,515, to Seaver, shows an optical switch for altering the path of an optical beam. The optical switch disclosed in Seaver is embodied as an unpatterned planar waveguide and utilizes an applied stress to alter the index of refraction of the planar waveguide material and thereby deflect the optical beam from an unstressed optical beam path to a stressed optical beam path. The stress may be applied to the planar waveguide by means of a magnetostrictive, electrostrictive or photostrictive material. While the Seaver system provides an effective mechanism for utilizing an applied stress to vary the index of refraction of a planar waveguide, the Seaver system does not confine the optical beam path to a particular defined path or channel through the device. In addition, planar waveguides are typically characterized by a lossy interface between the waveguide and an optical fiber.

As is apparent from the above discussion, a need exists for an improved integrated optical switching or modulation device. In addition, a need exists for an integrated optical switching or modulation device that allows a variable stress to be applied to a waveguide in order to alter the optical properties of the waveguide in a controlled and variable manner. A further need exists for integrated optical devices capable of switching or modulating an optical signal among channel waveguides without regard to the wavelength or polarization of the signal.

SUMMARY OF THE INVENTION

According to one aspect of the invention, integrated optical devices utilizing a magnetostrictively, electrostrictively or photostrictively induced stress to alter the optical properties of one or more waveguides in the integrated optical device are provided. The integrated optical devices consist of a pair of optical waveguides preferably fabricated in a cladding material formed on a substrate. A stress applying material, which may be a magnetostrictive electrostrictive or photostrictive material, is applied to the upper surface of the cladding material near at least one of the optical waveguides.

According to a feature of the present invention, a dimensional change tends to be induced in the stress applying material, which may be a magnetostrictive, electrostrictive or photostrictive material, upon application of an appropriate magnetic, electric or photonic field, respectively. Since dimensional changes in the stress applying material are constrained, however, by the adhesion of the stress applying material to the cladding, regions of tensile and compressive stress, as well as any associated strains, are created in the integrated optical device.

Thus, when an optical waveguide is positioned in a region of the integrated optical device which will be subjected to a tensile or compressive stress, the optical properties of the waveguide may be altered. In the present invention, the applied stress and any associated strain may be selectively and controllably varied by applying the appropriate magnetic, electric or photonic field to the stress applying material.

According to a further feature of the invention, latchable integrated optical devices are provided. In one embodiment, an induced stress is utilized to "tune" one or more waveguides in an integrated optical device to a desired refractive index or birefringence by controlling the strength and direction of the applied field. The tuned state, namely, the desired refractive index or birefringence, will remain intact, for many stress applying materials even after removal of the applied field, until a sufficiently large field is applied in a different direction, due to the hysteresis or coercive characteristics of certain stress applying materials.

In various disclosed embodiments, integrated optical devices in accordance with the present invention are embodied as variable stress directional couplers, adiabatic directional couplers and variable stress Mach-Zehnder interferometers. In addition, the integrated optical devices in accordance with the present invention may be interconnected into N×N linear or matrix switching networks.

A more complete understanding of the present invention, as well as further features and advantages of the invention, will be obtained by reference to the detailed description and drawings.

BRIEF DESCRIPTION OF THE DRAWINGS

FIGS. 4A through 4C illustrate the characteristics of a magnetostrictive material upon application of a magnetic field of different orientations;

DETAILED DESCRIPTION

Figure 1A:
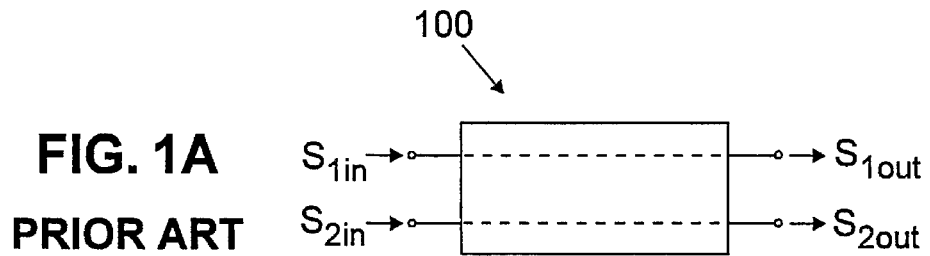
FIG. 1a–b is a diagram showing the functional operation of a conventional 2×2 optical waveguide switch.
Figure 1B:
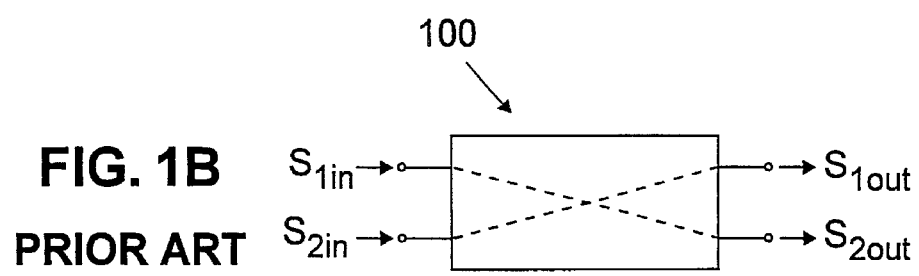

A conventional 2×2 optical waveguide switch 100, suitable for switching or modulating an optical signal, is illustrated in schematic block diagram form in FIG. 1. The optical switch 100 shown in FIG. 1 is a four-port device with two inputs, $S_{1in}$ and $S_{2in}$, and two outputs, $S_{1out}$ and $S_{2out}$. Thus, the optical switch 100 can have two switch states, namely, a straight-through state, illustrated in FIG. 1A, and a cross-over state, illustrated in FIG. 1B.

In the straight-through state, hereinafter referred to as the "bar state", an optical signal or lightwave entering the top input port, $S_{1in}$, exits through the top output port, $S_{1out}$. Similarly, an optical signal entering the bottom input port, $S_{2in}$ exits through the bottom output port, $S_{2out}$. In the cross-over state, hereinafter referred to as the "cross state", an optical signal entering the top port, $S_{1in}$, exits through the bottom output port, $S_{2out}$, while an optical signal entering the bottom input port, $S_{2in}$, crosses over and exits through the top output port, $S_{1out}$.

Figure 2:
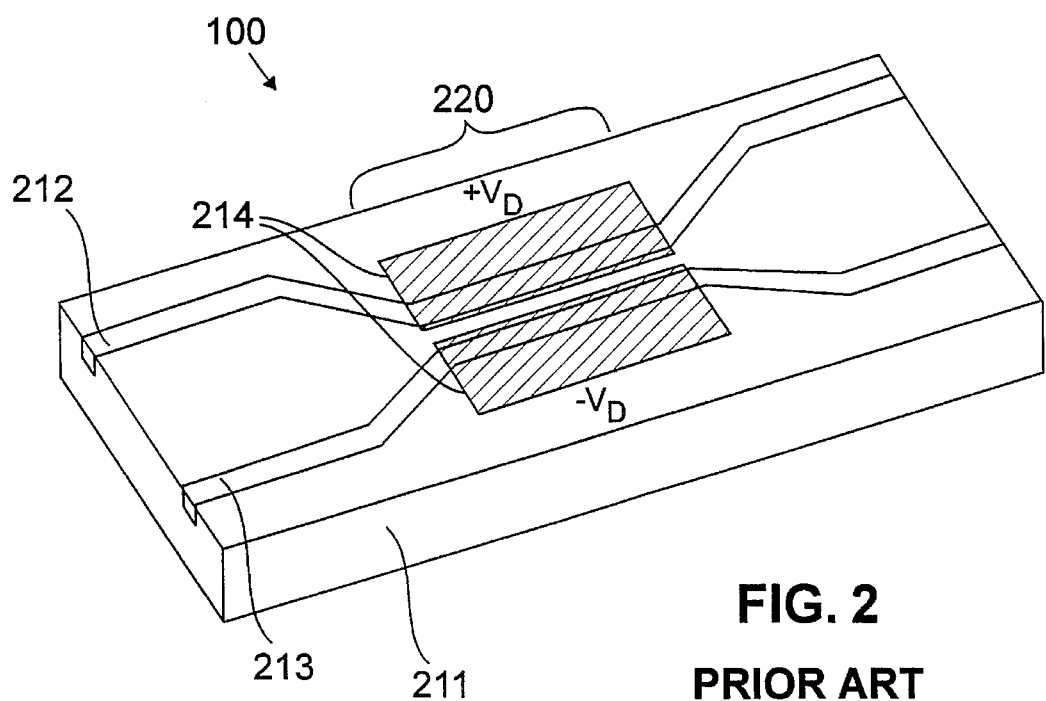
FIG. 2 is a plan view of a conventional directional coupler.

In one embodiment, illustrated in FIG. 2, an integrated optical switch 100 is typically comprised of two waveguides 212 and 213, which are fabricated in an electro-optic substrate 211, which may be, for example, lithium niobate ($LiNbO_3$). For a general discussion of conventional methods and materials for fabricating an optical switch, see R. G. Hunsperger, Integrated Optics: Theory and Technology (Springer-Verlag 1991); and Photonic Switching (T. K. Gustafson and P. W. Smith eds., Springer-Verlag 1988).

Generally, the waveguides 212, 213 can be formed in or on the electro-optic substrate 211 by a titanium diffusion process, or another suitable doping process which forms light guiding channels in or on the substrate 211. A dielectric layer (not shown), such as $SiO_2$, is then typically deposited on the upper surface of the substrate 211, above the parallel waveguides 212 and 213, in the coupling region 220, namely, the region over which the waveguides 212 and 213 are closely spaced and substantially parallel to provide optical coupling. Thereafter, an electrode structure 214 is formed over the waveguides 212, 213, using well known thin film deposition techniques and photolithography.

As illustrated in FIG. 2, a drive voltage, $V_D$, is applied to the electrode structure 214 to operate the switch in its cross and bar states. When a voltage is applied to the electro-optic material through the electrode structure 214, the optical properties of the material, such as its refractive index, will change, due to the well known electro-optic effect. Thus, by controlling the applied voltage, the changes in the refractive index of the waveguides necessary to effectuate either the cross or bar states of the switch may be achieved. Typically, one voltage, often referred to as the "cross state voltage", will make the optical signal cross over completely and another voltage, often referred to as the "bar state voltage", will make the optical signal go straight through.

Figure 3:
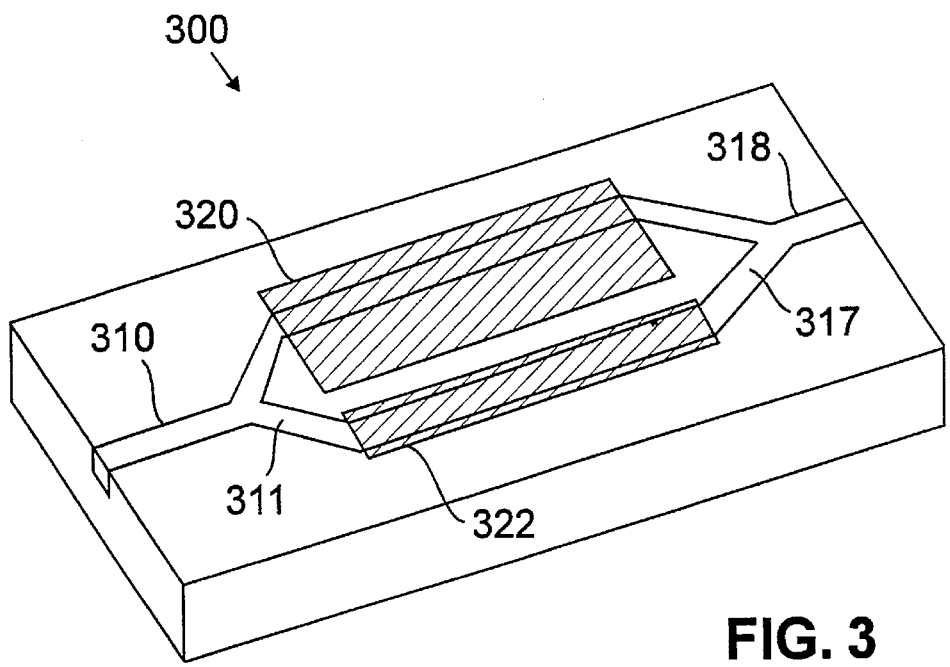
FIG. 3 is a plan view of a two-port Mach-Zehnder interferometer.

Another common integrated optical device 300, often referred to as a Mach-Zehnder interferometer, is illustrated in FIG. 3. The illustrated two-port Mach-Zehnder interferometer is suitable for on/off switching or modulation of an optical signal, in a known manner. The device 300 has an input waveguide 310 and an output waveguide 318, as well as two y-junctions 311 and 317 positioned therebetween. The y-junctions 311, 317 provide an equal division of the input optical power.

Thus, when an input optical signal is applied to the input waveguide 310, the signal will be split into two equal portions by the first y-junction 311. When no electric field is applied to the electrodes 320, 322, the two equal portions of the optical signal will arrive at the second y-junction in-phase, in a known manner. Thus, the two portions will combine constructively, providing a maximum intensity output at the output waveguide 318.

As the electric field applied to the electrodes 320, 322 is increased, the side of the waveguide structure exhibits an increased refractive index while the value of the refractive index on the other side is reduced, creating a differential phase change between the signals in the two arms. Thus, the two portions will combine destructively at the second y-junction 317. In this manner, the optical intensity in the optical signal at the output waveguide 318 is decreased. Thus, for predefined values of the applied electric field, the optical intensity at the output waveguide 318 may be controlled between a minimum optical intensity, such as zero, and a maximum value.

The integrated optical devices 100, 300 discussed above in conjunction with FIGS. 2 and 3 achieve their optical switching or modulation characteristics by utilizing an applied electric field to control the optical properties of the optical components in the device, in accordance with the electro-optic effect. In addition, other integrated optical devices have been developed which achieve optical switching or modulation characteristics by utilizing an applied magnetic field to control the optical properties of the optical components in the device, in accordance with the magneto-optic effect. For a general discussion of integrated optical devices based upon the magneto-optic effect, see J. P. Castera and P. L. Meunier, "Nonreciprocal Devices in Integrated Optics," Fiber and Integrated Optics, Vol. 8, 71–85 (1989), incorporated herein by reference.

INDUCED STRESS CONTROL OF OPTICAL PROPERTIES

According to a feature of the present invention, a magnetostrictively, electrostrictively or photostrictively induced stress, as well as any associated strain, as opposed to an applied electric or magnetic field, is utilized to control the optical properties of an optical waveguide in an integrated optical device. Magnetostriction is a well known property of magnetic materials, and is defined to be the change in the dimensions of a magnetostrictive material, such as nickel or an amorphous ferromagnetic material, or a metallic glass, such as METGLAS™ 2605 $S_2$ or 2605 SC, in response to an applied magnetic field.

Similarly, electrostriction and piezoelectricity are well known properties of certain materials and are defined to be the change in the dimensions of an electrostrictive or piezoelectric material, such as lead magnesium niobate or lead zirconate titanate, in response to an applied electric field. It is noted that for electrostrictive materials, the sign of the deformation which occurs with an applied electric field is independent of the polarity of the field, and is proportional to even powers of the applied field. For piezoelectric materials, however, the deformation is linear with respect to the applied electric field and changes sign when the electric field is reversed.

In an alternate embodiment, a photostrictively induced stress is utilized to control the optical properties of the optical waveguides in integrated optical devices. It is well known that light can create an electric field in certain ceramic materials, causing the ceramic materials to change dimensions. For further details of photostrictive materials, see Kenji Uchino & Sheng-Yuan Chu, "Photostriction and its Applications", Proc. of American Ceramic Society Conference, pp. 287–93 (Hawaii, November, 1993), incorporated herein by reference.

The characteristics of a magnetostrictive material 410 are illustrated in FIGS. 4A and 4B. If a uniform magnetic field, H, is applied to the magnetostrictive material 410, for example, by a current, I, in a conductor 405, the magnetostrictive material 410 may elongate to assume a shape 415, as shown in FIG. 4A, or may contract to assume a shape 425, as shown in FIG. 4B, depending on the sign of the magnetostriction constant, $\lambda$, of the magnetostrictive material 410. A suitable implementation for applying a magnetic field, H, oriented perpendicular to the magnetic field of FIG. 4A or 4B, is shown in FIG. 4C. It is noted that the direction of the magnetic field, H, is determined in accordance with the right hand rule.

Similarly, if a drive voltage, $V_D$, is applied to an electrostrictive or piezoelectric material, for example, by an electrode structure, the resultant electric field, E, will cause the electrostrictive material to elongate or contract, in a manner similar to the magnetostrictive material 410 shown in FIGS. 4A and 4B. For a detailed discussion of suitable magnetostrictive, electrostrictive and photostrictive materials, and their corresponding strictive constants, see Concise Encyclopedia of Magnetic & Superconducting Materials 283–87 (Jan Evetts ed., Pergamon Press 1992); Bernard Jaffe et al., Piezoelectric Ceramics 78–85 (Academic Press 1971); and Sheng-Yuan Chu & Kenji Uchino, "Photoacoustic Devices Using {Pb, La} {Zr, Ti} $O_3$ Ceramics", Int'l Symposium on Applications of Ferroelectrics, Proceedings of 1994 Conf. at Pennsylvania State Univ. (Summer 1994), each incorporated herein by reference.

It is noted that due to the hysteresis characteristics or coercivity of certain stress applying materials, the material may maintain the elongated or contracted position, even after the applied field is removed. For example, a magnetostrictive material will not change its dimensions until a field has been applied to change the magnetization state of the material. Thus, switches based on an induced stress are latchable switches that do not require the continuous application of power to maintain the switch in a desired state. Thus, an induced stress and any associated strain can be utilized to "tune" a waveguide to a desired refractive index or birefringence by controlling the strength and direction of the applied field. Thereafter, once the applied field is removed, the refractive index or birefringence of the waveguide will remain intact until a sufficiently large field is applied in a different direction.

Figure 5:
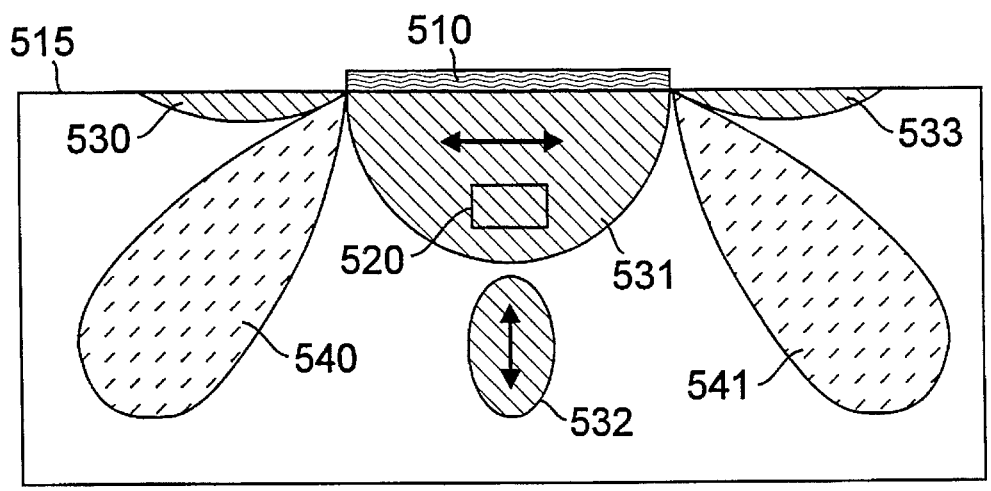
FIG. 5 illustrates a schematic diagram of a stress distribution analysis created by a stress induced upon a glass substrate material by a stress applying material.

FIG. 5 shows a stress applying material 510, which may be a magnetostrictive, electrostrictive or photostrictive material, applied to a glass substrate material 515, for example, by a sputtering or evaporation process. Since dimensional changes in the stress applying material 510 are constrained by its adherence to the substrate material 515, application of an appropriate magnetic, electric or photonic field will create regions of tensile stress 530–533 and regions of compressive stress 540–541 in the glass substrate material 515, as schematically illustrated in FIG. 5. It is noted that the dimensional changes in the stress applying material 510 may create associated regions of strain as well. It has been found that when an optical waveguide 520 is positioned in the glass substrate material 515 in a region which will be subjected to a tensile or compressive stress, such as the region 531, the optical properties of the waveguide 520 may be varied. In the present invention, the applied stress and any associated strain can be controllably varied by the application of the appropriate magnetic, electric or photonic field to the stress applying material.

As previously indicated, when a stress is applied to an optical material, such as the optical waveguide 520 positioned in the glass substrate material 515, the index of refraction, in other words, the speed of light in the optical material, will change. Typically, when the optical waveguide 520 is subjected to a transverse tensile stress, the index of refraction of the waveguide 520 will decrease, and when subjected to a transverse compressive stress, the index of refraction of the waveguide 520 will increase.

Thus, according to a feature of the invention, integrated optical switching and modulation devices may be constructed which utilize magnetostrictive, electrostrictive or photostrictive materials to apply a localized stress to one or more regions of an optical waveguide. In this manner, by controlling the polarity and strength of the applied field, the optical properties of the waveguide 520 may thereby be varied to achieve the desired switching or modulation of an optical signal propagating in the waveguide 520, as discussed below.

VARIABLE STRESS DIRECTIONAL COUPLERS

Figure 6A:
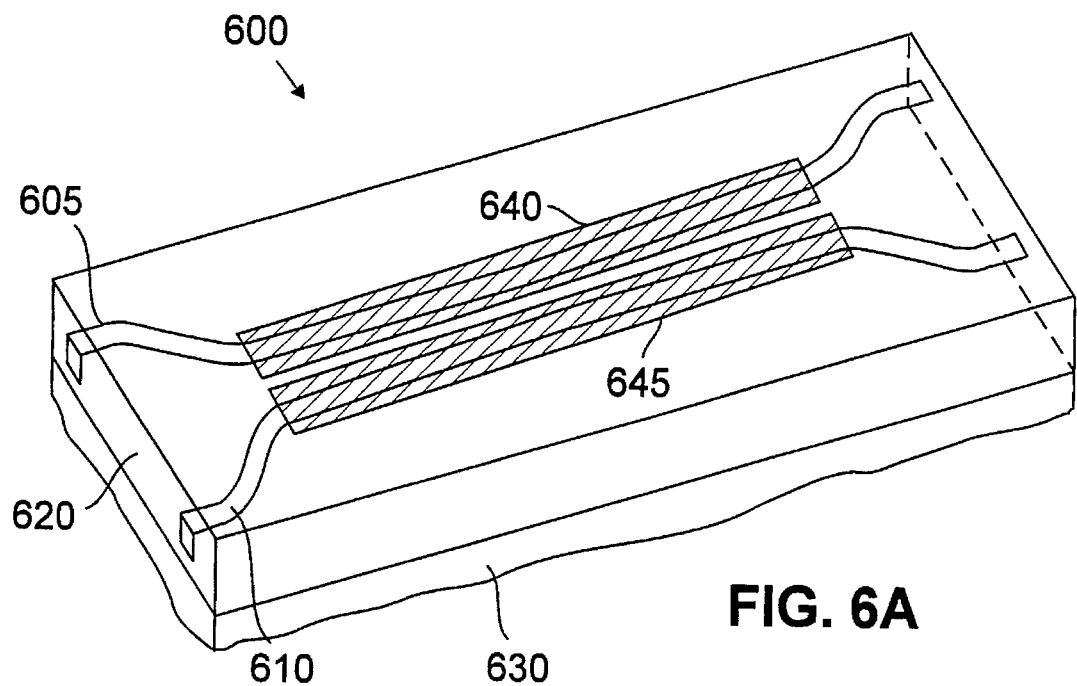
FIG. 6A illustrates a directional coupler in accordance with the present invention.

In one presently preferred embodiment, illustrated in FIG. 6A, a variable stress directional coupler 600 is comprised of two optical waveguides 605 and 610, fabricated in a cladding material 620, formed on a substrate 630, such as silicon (Si). The optical waveguides 605, 610 may be, for example, phosphorous or germanium doped silica ($SiO_2$—$P_2O_5$ or $SiO_2$—$GeO_2$). A stress applying material 640, which may be a magnetostrictive, electrostrictive or photostrictive material, is applied to the upper surface of the cladding material 620, for example, by a sputtering or evaporation process, near a waveguide 605 or 610 in the coupling region.

In a preferred embodiment, a second stress applying material 645 is applied near the second waveguide 605 or 610 in order to provide symmetry, although the applied field will typically be applied to only one stress applying material 640 or 645 at any given time. It is noted that if the first and second stress applying materials 640, 645 have opposite strictive constants, a field can be applied to both stress applying materials 640, 645 at the same time to induce an increase in the refractive index of one waveguide, while at the same time inducing a decrease in the refractive index of the second waveguide. The cladding material 620, which may be, for example, pure silica ($SiO_2$), provides a spacing layer between the stress applying material 640, 645 and the optical waveguides 605, 610.

As previously indicated, an applied field is utilized to induce a dimensional change in the stress applying material 640. When the stress applying material 640, 645 is embodied as a magnetostrictive material, the dimensional change is induced by a magnetic field, H, applied to the magnetostrictive material 640 or 645. The magnetic field, H, may be applied to the magnetostrictive material 640 or 645, for example, by a current, I, in a conductor 405, in a manner similar to the arrangement shown in FIG. 4. Alternatively, when the stress applying material 640, 645 is embodied as an electrostrictive material, the dimensional change is induced by an electric field, created by a drive voltage, $V_D$, applied to the electrostrictive material 640 by means of an electrode structure (not shown), in the manner described above. Finally, when the stress applying material 640, 645 is embodied as a photostrictive material, the dimensional change is induced by an applied photonic field, in other words, an illumination driving light of an appropriate wavelength and intensity.

Upon application of the appropriate magnetic, electric or photonic field, the constrained state of the stress applying material 640 or 645, due to its adhesion to the cladding 620, will prevent a change in dimensions, and thereby create regions of stress in the cladding 620, as well as any associated regions of strain, in the manner described above. The applied stress will serve to alter the optical properties, such as the refractive index, of the waveguide 605 or 610 which has been positioned in a region of the cladding 620 which will experience a transverse compressive or tensile stress. In this manner, light that enters the variable stress directional coupler 600 by means of one waveguide 605 or 610, can be switched back and forth between the two output ports by controlling the polarity and strength of the applied field. The optical operation of the variable stress directional coupler 600 is similar to that of the directional coupler 100, discussed above in conjunction with FIG. 2.

It is noted that the variable stress directional coupler 600 would typically have an overall length on the order of 1.5 cm, including a coupling region length of 2 mm. Typically, the waveguides 605 and 610 would have a height and a width of 5 microns. Preferably, the cladding 620 on the substrate 630 would be approximately 35 microns thick. In addition, the two waveguides 605 and 610 would typically be separated by a center-to-center spacing of 9–10 microns in the coupling region, and 250 microns at the ends of the variable stress directional coupler 600, in order to receive the optical fibers. These typical dimensions would be applicable, for example, when the fractional refractive index difference, Δ, between the refractive indices of the core and the cladding is about 0.6%. It is noted that the transition of the waveguides 605 and 610 as they come closer together in the coupling region, and then separate, would be more gradual than shown in the illustration of FIG. 6A. The thickness of the stress applying materials 640 and 645 is preferably on the order of several microns.

Figure 6B:
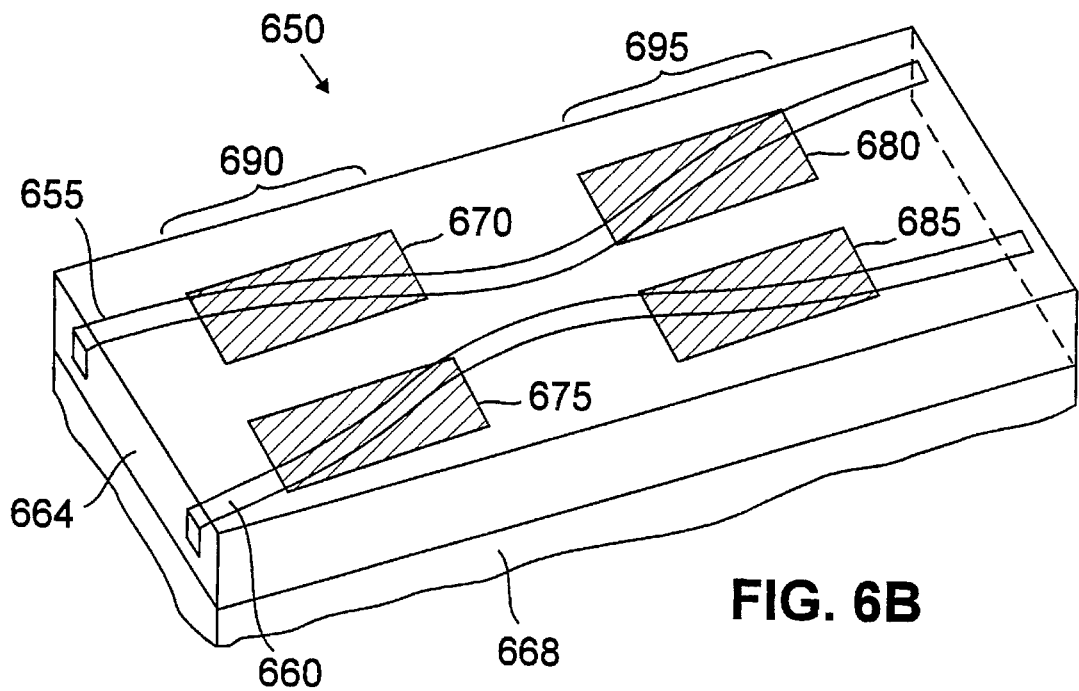
FIG. 6B illustrates an adiabatic directional coupler in accordance with the present invention.

In a preferred embodiment, the variable stress optical switch 600 comprises an adiabatic directional coupler 650, illustrated in greater detail in FIG. 6B, thereby making the optical switch less wavelength and polarization dependent. As is well known, adiabatic devices have the added advantage of not requiring a critical control of parameters to achieve high performance. It is noted that in an adiabatic directional coupler 650, the two waveguides 655, 660 are characterized by smooth transition regions 690 and 695 as the waveguides come closer together in the coupling region and then separate. For a detailed discussion of adiabatic devices, see Yosi Shani et al., "Integrated Optic Adiabatic Devices on Silicon," IEEE Journal of Quantum Electronics, Vol. 27, No. 3, pp. 556–66 (March, 1991), incorporated herein by reference.

In general, an optical signal travelling in a directional coupler will exhibit two modes in the coupling region, namely, a fundamental mode and a first order mode. In an adiabatic device, however, the degree to which the two lowest optical modes are populated, by definition, does not change as the optical signal propagates through the coupling region. Thus, if the fundamental mode is initially excited in the coupling region, all of the optical power will remain in the fundamental mode as the optical signal propagates through the coupling region towards the output of the device. Similarly, if the first order mode is initially excited in the coupling region, all of the optical power will remain in the first order mode as the optical signal propagates through the coupling region towards the output of the device.

In an adiabatic device, the relative refractive indices of the two waveguides 655, 660 as they come close together in the coupling region determines whether the fundamental or first order mode is initially excited. If an input optical signal is applied to a first waveguide 655 or 660 of an adiabatic device 650 having a higher effective refractive index in the input transition region 690 than the second waveguide, then the fundamental mode will be initially excited in the coupling region. Likewise, if an input optical signal is applied to a first waveguide 655, 660 of the adiabatic device 650 having a lower effective refractive index in the input transition region 690 than the second waveguide, then the first order mode will be initially excited in the coupling region. As discussed below, it is the relative effective refractive index in the output transition region 695 that determines whether the optical signal will appear at the output of the first or second waveguide 655, 660.

Furthermore, as previously indicated, once excited, the degree to which the two lowest modes are populated in the coupling region does not change as the optical signal propagates through the adiabatic device. Thus, energy in the fundamental mode will remain in the fundamental mode and energy in the first order mode will remain in the first order mode as the optical signals propagate through the adiabatic device 650. Accordingly, if the optical signal enters the adiabatic device 650 by means of a waveguide having the higher effective refractive index in the input transition region 690, then it will depart the adiabatic device by means of the waveguide having the higher effective refractive index in the output transition region 695. Likewise, if the optical signal enters the adiabatic device by means of a waveguide having the lower effective refractive index in the input transition region 690, then it will depart the adiabatic device by means of the waveguide having the lower effective refractive index in the output transition region 695.

Thus, according to a feature of the present invention, the effective relative refractive indices of the two waveguides 655, 660 can be selectively manipulated in the input and output transition regions 690, 695, using stress applying materials, to switch the adiabatic coupler 650 between the cross and bar states. In one embodiment, shown in FIG. 6B, a magnetostrictively, electrostrictively or photostrictively induced stress may be selectively applied to one or both waveguides 655, 660 at one or both of the input or output transition regions 690, 695, utilizing stress applying materials 670, 675, 680, 685. In this manner, the relative effective refractive indices of the two waveguides 655, 660 in both the input and output regions 690, 695 may be controlled to switch the adiabatic directional coupler 650 between the cross and bar states. It is noted that to switch the adiabatic directional coupler 650 between the cross and bar states, the applied stress need only be greater than some predefined threshold stress, and need not be a precise stress value.

For example, if an optical signal is applied to the input of the first waveguide 655, configured by means of the stress applying films 670 and 675 to have a higher effective index of refraction in the input transition region 690 than the second waveguide 660, then the fundamental mode will be initially excited in the input transition region 690. Thereafter, the index of refraction of the waveguides 655, 660 can be selectively varied in the output transition region 695, utilizing the stress applying films 680, 685, such that the index of refraction of only one of the waveguides 655, 660 in the output transition region 695 matches the index of refraction of the first waveguide 655 in the input transition region, and thereby supports the excited fundamental mode.

Thus, if the first waveguide 655 is configured to have the higher effective refractive index in the input transition region 690 and it is desired to switch the optical signal from the input of the first waveguide 655 to the output of the second waveguide 660, then the relative indices of refraction of the waveguides 655, 660 should be adjusted in the output transition region 695 such that the second waveguide 660 has the higher effective index of refraction in the output transition region 695 when compared to the first waveguide 655. As the optical signal travels in the coupling region towards the output transition region 660, the two waveguides are configured to change their indices of refraction, such that the first waveguide 655 assumes the lower effective index of refraction, while the second waveguide 660 now assumes the higher effective index of refraction. Thus, the optical power will stay in the fundamental mode in the coupling region, and will be transferred from the input of the first waveguide 655 to the output of the second waveguide 660, which now has the higher relative effective refractive index.

In addition, if the adiabatic device 650 were configured such that the first waveguide 655 has the higher effective refractive index in the input transition region 690 and the second waveguide 660 has the higher effective refractive index in the output transition region 695, as in the previous example, but now the input signal is applied to the second waveguide 660, then the first order mode will be initially excited in the input transition region 690. As the optical signal travels in the coupling region towards the output transition region 695, the optical power will remain in the first order mode, and will be transferred from the input of the second waveguide 660 to the output of the first waveguide 655.

In this manner, an optical signal that enters the adiabatic directional coupler 650 by means of one waveguide 655 or 660, can be switched back and forth between the two output ports by controlling the polarity and strength of the fields applied to each of the stress applying materials 670, 675, 680, 685 in the transition regions 690, 695. It is noted that the adiabatic directional coupler 650 can be constructed such that one of the waveguides 655 or 660 will always have a higher relative effective refractive index in either the input or output transition region 690, 695, for example, by means of a permanently applied fixed stress. In such an embodiment, the adiabatic directional coupler 650 can be fabricated with as few as one of the stress applying elements 670, 675, 680, 685 to apply a variable stress to one of the waveguides 690 or 695 and thereby control the relative effective refractive index of the waveguides 690, 695 in the transition region not having a permanently applied fixed stress.

It is noted that the adiabatic directional coupler 650 would typically have an overall length on the order of 1.0 cm. Typically, the waveguides 655 and 660 would have a height and a width of 5 microns. Preferably, the cladding 664 on the substrate 668 would be approximately 35 microns thick. In addition, the two waveguides 655 and 660 would typically be separated by a center-to-center spacing of 7 microns in the coupling region, and 15 microns at the ends of the cut-away view of the adiabatic directional coupler 650 shown in FIG. 6B. Of course, the two waveguides 655 and 660 would gradually be separated to a center-to-center spacing of about 250 microns before receiving the optical fibers. These typical dimensions would be applicable, for example, when the fractional refractive index difference, $\Delta$, between the refractive indices of the core and the cladding is about 0.6%. The thickness of the stress applying materials 670, 675, 680, and 685 is preferably on the order of several microns.

VARIABLE STRESS MACH-ZEHNDER DEVICES

Figure 7:
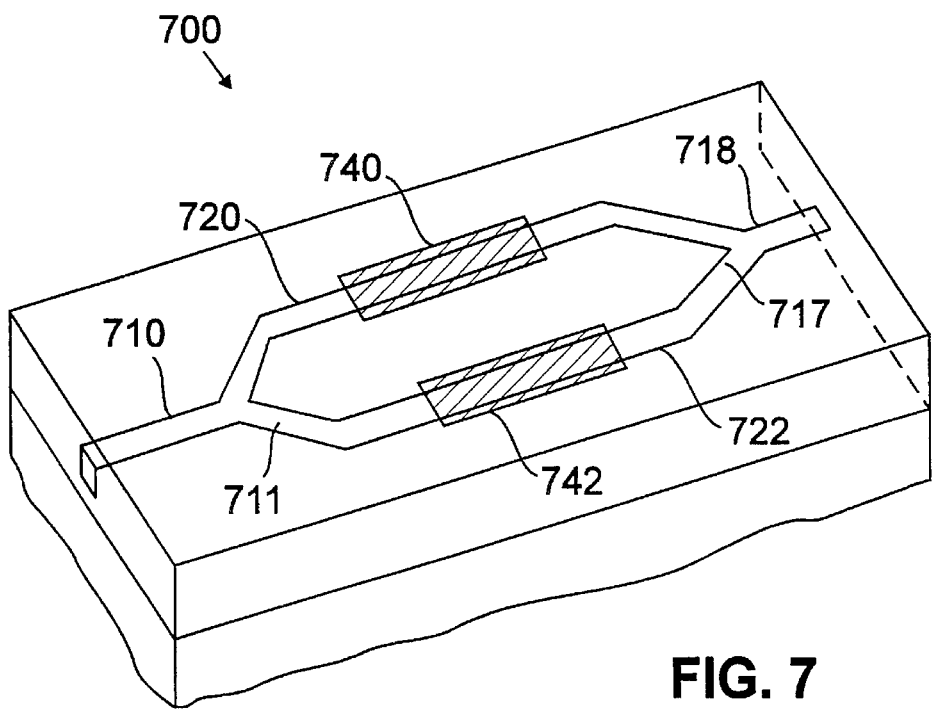
FIG. 7 illustrates a two-port Mach-Zehnder interferometer in accordance with the present invention.

A two-port variable stress Mach-Zehnder interferometer 700 is illustrated in FIG. 7. The device 700 has an input waveguide 710 and an output waveguide 718, as well as two y-junctions 711 and 717 positioned therebetween. The y-junctions 711, 717 provide an equal division of the input optical power among the two waveguide branches 720, 722. Thus, when an input optical signal is applied to the input waveguide 710, the signal will be split into two equal portions by the first y-junction 711.

When no stress is applied to the either of the two waveguide branches 720, 722, the two equal portions of the optical signal will arrive at the second y-junction 717 in-phase, in a known manner, assuming that the optical path lengths of the two branches are the same or differ by an integer multiple of the wavelength of the optical signal propagating in the branches 720, 722. It is noted that the optical path length of a waveguide is equal to the physical length of the waveguide multiplied by its index of refraction. Thus, the two portions of the optical signal will combine constructively at the second y-junction 717, providing a maximum intensity output at the output waveguide 718.

If, however, a stress is applied to one of the waveguide branches 720, 722, by means of an appropriate field applied to a stress applying material 740 or 742, near one of the branches 720 or 722, respectively, in the manner described above, one of the branches 720 or 722 of the waveguide structure exhibits an altered refractive index while the value of the refractive index on the other branch is unchanged. Thus, a differential phase change is created between the signals in the two branches 720, 722. Accordingly, the two portions will combine out of phase at the second y-junction 717. By adjusting the index of refraction of one of the waveguides in this manner, the difference in the optical path lengths between the two waveguides is likewise changed and the degree of the phase differential may thereby be controlled 6o adjust the optical intensity at the output waveguide 718. Thus, for predefined polarities and strengths of the appropriate applied magnetic, electric or photonic field, the optical intensity at the output waveguide 718 may be predicted to achieve on/off switching and modulation.

It is noted that the two-port variable stress Mach-Zehnder interferometer 700 would typically have an overall length on the order of 13 mm, including each of the branches 720, 722 having a length of 5 mm and each of the y-junctions 711, 717 having a length of 4 mm. Typically, the waveguides would have a height and a width of 5 microns. Preferably, the cladding on the substrate would be approximately 35 microns thick. In addition, the two waveguide branches 720 and 722 would typically be separated by a center-to-center spacing of 100 microns. These typical dimensions would be applicable, for example, when the fractional refractive index difference, $\Delta$, between the refractive indices of the core and the cladding is about 0.6%. The thickness of the stress applying materials 740 and 742 is preferably on the order of several microns.

Figure 8:
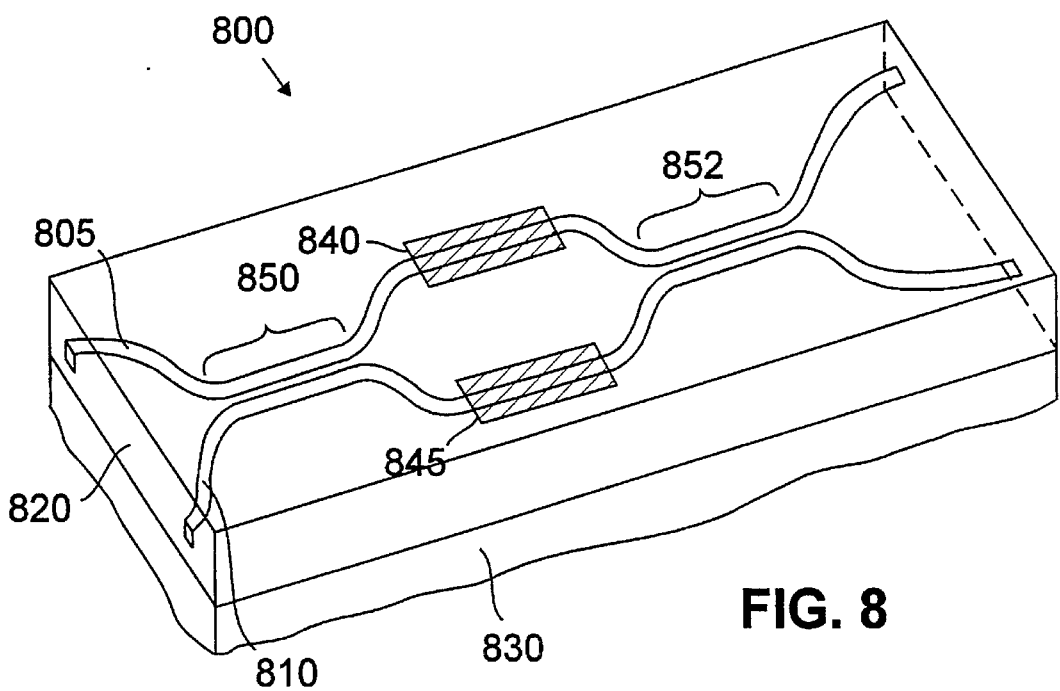
FIG. 8 illustrates a four-port Mach-Zehnder interferometer in accordance with the present invention.

A four-port variable stress Mach-Zehnder interferometer 800 is illustrated in FIG. 8. The device 800 is comprised of two optical waveguides 805 and 810, fabricated in a cladding material 820, formed on a substrate 830, such as silicon (Si). The optical waveguides 805, 810 may be, for example, phosphorous doped silica ($SiO_2$—$P_2O_5$). As is well known, a four-port Mach-Zehnder device is typically constructed with two 3 dB coupling regions 850, 852.

A stress applying material 840, which may be a magnetostrictive, electrostrictive or photostrictive material, is applied to the upper surface of the cladding material 820, near a waveguide 805 or 810, as shown in FIG. 8. In a preferred embodiment, a second stress applying material 845 is applied near the second waveguide 805 or 810 in order to provide symmetry, although the applied field will typically only be applied to the stress applying material 840 or 845 near one waveguide at any given time.

As previously indicated, an applied magnetic, electric or photonic field can be utilized to induce the desired dimensional change in the stress applying material 840, 845 of the Mach-Zehnder device 800 in the manner described above in conjunction with FIG. 6A. Upon application of the necessary magnetic, electric or photonic field, the constrained state of the stress applying material 840 or 845, due to its adhesion to the cladding material 820, will prevent a change in dimensions of the stress applying material 840 or 845, and thereby create regions of stress in the cladding 820, in the manner described above. The applied stress will serve to alter the optical properties, such as the refractive index, of the waveguide 805 or 810 which has been positioned in a region of the cladding 820 which will experience a transverse compressive or tensile stress. In this manner, light that enters the variable stress Mach-Zehnder device 800 by means of one waveguide 805 or 810, can be switched back and forth between the two output ports by controlling the polarity and strength of the applied field.

Typically, to achieve the "cross state" in a four-port Mach-Zehnder optical device, such as the device 800, the optical path lengths of the two waveguides 805 and 810 must be the same or differ by a multiple of the wavelength of the optical signal propagating in the waveguides 805, 810. It is again noted that the optical path length of a waveguide is equal to the physical length of the waveguide multiplied by the index of refraction of the waveguide. To achieve the "bar state" in such a device 800, the difference in the length of the optical paths between the two waveguides 805, 810 must be a half-wavelength or an odd integer multiple thereof, in a known manner.

In a preferred embodiment, one of the waveguides 805 or 810 in the Mach-Zehnder device 800 is longer than the length of the second waveguide by half a wavelength or an odd integer multiple thereof. In this manner, when no stress is applied to either of the waveguides, the switch element 800 will be in the "bar state". Thus, in order to place the switch in the "cross state", a stress must be applied to one of the waveguides, by means of a dimensional change in the stress applying material 840 or 845, in order to alter the index of refraction of the waveguide. The applied stress should alter the index of refraction of one waveguide such that the optical path length of each of the waveguides 805, 810 are now the same or differ by a multiple of the wavelength of the optical signal propagating in the waveguides 805, 810.

It is noted that the four-port variable stress Mach-Zehnder interferometer 800 would typically have an overall length on the order of 1.0 cm, including each of the two 3 dB regions 850, 852 having a length of 1 mm and a coupling region length of 5 mm. Typically, the waveguides 805 and 810 would have a height and a width of 5 microns. Preferably, the cladding 820 on the substrate 830 would be approximately 35 microns thick. In addition, the two waveguides 805 and 810 would typically be separated by a center-to-center spacing of 100 microns in the coupling region, 9 microns in each of the 3 dB regions 850 and 852, and 250 microns at the ends of the four-port variable stress Mach-Zehnder interferometer 800, in order to receive the optical fibers. These typical dimensions would be applicable, for example, when the fractional refractive index difference, $\Delta$, between the refractive indices of the core and the cladding is about 0.6%. The thickness of the stress applying materials 840 and 845 is preferably on the order of several microns.

It is further noted that for certain of the embodiments discussed above in conjunction with FIGS. 6 through 8, it may be desirable to apply an adhesion layer, such as titanium-palladium, for example, between the electrode structure and cladding material in an electrostrictive implementation, in order to improve the adhesion of the metallic materials to the silica-based cladding.

SWITCHING MATRICES COMPRISED OF VARIABLE STRESS SWITCH ELEMENTS

The switching devices 600, 650, 800, discussed above in conjunction with FIGS. 6 and 8, can be connected into N×N linear or matrix switching networks. For a general discussion of suitable linear or matrix switching networks, see K. Padmanabhan and A. Netravali, "Dilated Networks for Photonic Switching," IEEE Trans. on Communications, Vol. Com.-35, No. 12, 1357–365 (December 1987) and J. R. Erickson, "Signal-to-Noise Ratio Simulations for Small, Guided-wave Optical Networks," SPIE Digital Optical Computing, Vol. 752, 222–29 (1987), each incorporated herein by reference. FIG. 9 provides a schematic representation of four individual switching devices, labelled switch A, switch B, switch C and switch D, which have been interconnected to form an illustrative 4×4 switch 1000, as shown in further detail in FIG. 10.

Figure 9A:
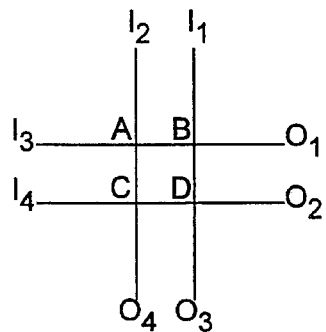
FIGS. 9a–c and 10 illustrate a 4×4 switch comprised of four 2×2 switch elements in accordance with the present invention.
Figure 9B:
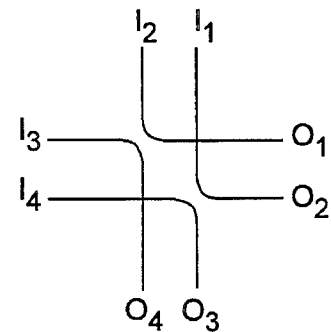
Figure 9C:
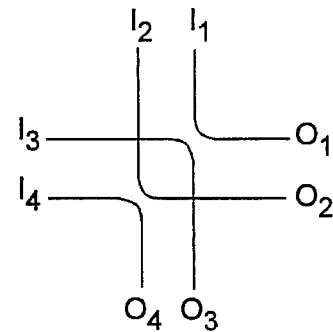
Figure 10:
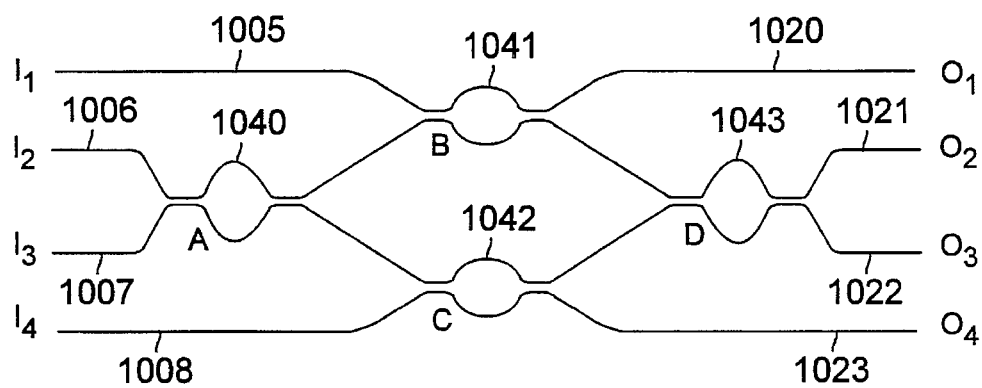

Each of the four individual switch elements 1040 through 1043, labelled A through D, shown in FIG. 10, is preferably embodied as an adiabatic coupler 650 or a four-port Mach-Zehnder interferometer 800. The switch 1000 illustrated in FIGS. 9 and 10, is comprised of four input ports 1005 through 1008, labelled $I_1$ through $I_4$, and four output ports 1020 through 1023, labelled $O_1$ through $O_4$. Interconnection is possible between any input line, $I_1$ through $I_4$, and any output line, $O_1$ through $O_4$, by engaging the appropriate crosspoints.

The four switch elements A through D are each in the cross state in the example illustrated in FIG. 9A. Thus, if an optical signal is applied to the first input, $I_1$, of the switch 1000, the optical signal will appear at output $O_3$. If an optical signal is applied to the second input, $I_2$, of the switch 1000, the optical signal will appear at output $O_4$. If an optical signal is applied to the third input, $I_3$, of the switch 1000, the optical signal will appear at output $O_1$. Finally, if an optical signal is applied to the fourth input, $I_4$, of the switch 1000, the optical signal will appear at output $O_2$.

In the example illustrated in FIG. 9B, switch elements A and D are each in the bar state, while switch elements B and C are in the cross state. Thus, if an optical signal is applied to the first input, $I_1$, of the switch 1000, the optical signal will appear at output $O_2$. If an optical signal is applied to the second input, $I_2$, of the switch 1000, the optical signal will appear at output $O_1$. If an optical signal is applied to the third input, $I_3$, of the switch 1000, the optical signal will appear at output $O_4$. Finally, if an optical signal is applied to the fourth input, $I_4$, of the switch 1000, the optical signal will appear at output $O_3$.

In the example illustrated in FIG. 9C, switch elements A and D are each in the cross state, while switch elements B and C are in the bar state. Thus, if an optical signal is applied to the first input, $I_1$, of the switch 1000, the optical signal will appear at output $O_1$. If an optical signal is applied to the second input, $I_2$, of the switch 1000, the optical signal will appear at output $O_2$. If an optical signal is applied to the third input, $I_3$, of the switch 1000, the optical signal will appear at output $O_3$. Finally, if an optical signal is applied to the fourth input, $I_4$, of the switch 1000, the optical signal will appear at output $O_4$.

It is noted that an important characteristic of any matrix switch, such as the switch 1000, is whether the switch is a blocking or nonblocking device. Blocking occurs when a switch, such as the switch 1000, is unable to connect two ports because all possible paths between the two ports are already in use. While a blocking switch allows such blocking, a nonblocking switch permits all ports to be connected, in pairs, at once and grants all possible connection requests. For example, if the switch 1000 was configured such that a path was established between input $I_3$ and output $O_2$, then the switch 1000 would be in a blocked state, because it would not be possible to make a connection, for example, between input $I_4$ and output $O_3$.

The switch 1000 can be implemented as a strictly nonblocking switch if two particular inputs and two particular outputs are utilized. For example, inputs $I_1$ and $I_2$ and outputs $O_1$ and $O_2$ can be configured in a nonblocking switch. Alternatively, inputs $I_3$ and $I_4$ and outputs $O_3$ and $O_4$ could be configured in a nonblocking switch. In general, an N×N switch, comprised of $N^2$ 2×2 switching elements, can be configured as an N×N strictly nonblocking switch.

It is to be understood that the embodiments and variations shown and described herein are illustrative of the principles of this invention only and that various modifications may be implemented by those skilled in the art without departing from the scope and spirit of the invention.

We claim:

1. An integrated optical switching or modulation device comprising:

a first and second channel waveguide formed in or on a substrate, each of said first and second channel waveguides having a refractive index, said refractive index of at least one of said first and second channel waveguides changing with an applied stress; and a stress applying material affixed to a region of said device, said stress applying material selected from the group of magnetostrictive, electrostrictive or photostrictive materials, said stress applying material creating at least one region of stress in said device upon application of magnetic, electrical or photonic energy respectively, wherein at least one of said first and second channel waveguides is positioned in said at least one created region of stress.

2. The integrated optical device of claim 1, wherein an optical beam propagating in said first channel waveguide may be switched to said second channel waveguide upon a predetermined application of said energy.

3. The integrated optical device of claim 1, wherein the optical energy in at least one of said first or second channel waveguides may be switched or modulated between an on and an off state upon a predetermined application of said energy.

4. The integrated optical device of claim 1, wherein said stress applying film applies a variable stress to said first or second channel waveguide positioned in said region of stress, said variable stress allowing a continuous range of optical intensities to be provided at the output of said optical device.

5. The integrated optical device of claim 1, wherein said stress applying film continues to apply said stress after removal of said energy.

6. The integrated optical device of claim 5, wherein said applied energy can be varied to tune said optical device to a desired birefringence, said desired birefringence being retained until a sufficiently large field is applied in a different direction.

7. A directional coupler for switching or modulating an optical signal, said directional coupler comprising:

a first and second channel waveguide formed in or on a substrate, each of said first and second channel waveguides having a refractive index, said first and second channel waveguides being closely disposed to one another in a coupling region, said refractive index of at least one of said first and second channel waveguides changing with an applied stress; and a stress applying material affixed to a region of said directional coupler in said coupling region, said stress applying material selected from the group of magnetostrictive, electrostrictive or photostrictive materials, said stress applying material creating at least one region of stress in said directional coupler upon application of magnetic, electrical or photonic energy respectively, wherein at least one of said first and second channel waveguides is positioned in said at least one created region of stress.

8. The directional coupler of claim 7, wherein said directional coupler is an adiabatic device, said adiabatic directional coupler having an input transition region and an output transition region as said first and second channel waveguides come together and separate in said coupling region, said stress applying material controlling the relative effective refractive indices between said first and second channel waveguides in at least one of said input or output transition regions.

9. The directional coupler of claim 7, wherein an optical beam propagating in said first channel waveguide may be switched to said second channel waveguide upon a predetermined application of said energy.

10. The directional coupler of claim 7, wherein the optical energy in at least one of said first or second channel waveguides may be switched or modulated between an on and an off state upon a predetermined application of said energy.

11. The directional coupler of claim 7, wherein said stress applying film applies a variable stress to said first or second channel waveguide positioned in said region of stress, said variable stress allowing a continuous range of optical intensities to be provided at the output of said optical device.

12. The directional coupler of claim 7, wherein said stress applying film continues to apply said stress after removal of said energy.

13. The directional coupler of claim 12, wherein said applied energy can be varied to tune said optical device to a desired birefringence, said desired birefringence being retained until a sufficiently large field is applied in a different direction.

14. A Mach-Zehnder interferometer structure formed in or on a substrate, said Mach-Zehnder interferometer comprising:

an optical input coupled to a first y-junction, said first y-junction dividing an optical signal applied to said optical input, said branches of said y-junction coupled to two substantially parallel channel optical waveguides;

a second y-junction combining said two substantially parallel channel optical waveguides into an optical output; and a stress applying material affixed to a region of said structure, said stress applying material selected from the group of magnetostrictive, electrostrictive or photostrictive materials, said stress applying material creating at least one region of stress in said structure upon application of magnetic, electrical or photonic energy respectively, wherein at least one of said substantially parallel channel optical waveguides is positioned in said at least one created region of stress.

15. The Mach-Zehnder interferometer of claim 14, wherein the energy of an optical signal applied to said optical input may be switched or modulated between an on and an off state upon a predetermined application of said energy.

16. The Mach-Zehnder interferometer of claim 14, wherein said application of said energy to said stress applying material controls the effective optical path length of said channel optical waveguide positioned in said region of stress.

17. The Mach-Zehnder interferometer of claim 16, wherein said effective optical path length may be selectively controlled to create a predetermined phase differential between optical signals in said two substantially parallel channel optical waveguides as they are combined at said second y-junction.

18. A Mach-Zehnder interferometer structure comprising:

a first and second channel waveguide formed in or on a substrate, each of said first and second channel waveguides having a refractive index, said first and second channel waveguides being closely disposed to one another in two coupling regions, each of said coupling regions having a 3 dB coupling ratio, said refractive index of at least one of said first and second channel waveguides changing with an applied stress; and a stress applying material affixed to a region of said structure, said stress applying material selected from the group of magnetostrictive, electrostrictive or photostrictive materials, said stress applying material creating at least one region of stress in said structure upon application of magnetic, electrical or photonic energy respectively, wherein at least one of said first and second channel waveguides is positioned in said at least one created region of stress.

19. The Mach-Zehnder interferometer of claim 18, wherein an optical beam propagating in said first channel waveguide may be switched to said second channel waveguide upon a predetermined application of said energy.

20. The Mach-Zehnder interferometer of claim 18, wherein the energy of an optical signal applied to said optical input may be switched or modulated between an on and an off state upon a predetermined application of said energy.

21. The Mach-Zehnder interferometer of claim 18, wherein said application of said energy to said stress applying material controls the effective optical path length of said channel optical waveguide positioned in said region of stress.

22. The Mach-Zehnder interferometer of claim 21, wherein said effective optical path length may be selectively controlled to create a predetermined phase differential between optical signals in said two substantially parallel channel optical waveguides at the output of said interferometer.

23. An optical switching network comprising a plurality of integrated optical switching devices, wherein each of said integrated optical switching devices includes:

a first and second channel waveguide formed in or on a substrate, each of said first and second channel waveguides having a refractive index, said refractive index of at least one of said first and second channel waveguides changing with an applied stress; and a stress applying material affixed to a region of said device, said stress applying material selected from the group of magnetostrictive, electrostrictive or photostrictive materials, said stress applying material creating at least one region of stress in said device upon application of magnetic, electrical or photonic energy respectively, wherein at least one of said first and second channel waveguides is positioned in said at least one created region of stress such that an optical beam propagating in said first channel waveguide may be switched to said second channel waveguide upon a predetermined application of said energy.

24. The optical switching network of claim 23, wherein said switching network is a strictly nonblocking switching network.

* * * * *